(12) United States Patent
Yuan et al.

(10) Patent No.: US 12,062,304 B2
(45) Date of Patent: Aug. 13, 2024

(54) ARRAY SUBSTRATE AND TESTING METHOD THEREOF

(71) Applicants: HEFEI BOE JOINT TECHNOLOGY CO., LTD., Anhui (CN); BOE Technology Group Co., Ltd., Beijing (CN)

(72) Inventors: Zhidong Yuan, Beijing (CN); Yongqian Li, Beijing (CN); Can Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 795 days.

(21) Appl. No.: 17/262,775

(22) PCT Filed: Jun. 2, 2020

(86) PCT No.: PCT/CN2020/094009
§ 371 (c)(1),
(2) Date: Jan. 25, 2021

(87) PCT Pub. No.: WO2020/253522
PCT Pub. Date: Dec. 24, 2020

(65) Prior Publication Data
US 2021/0256889 A1    Aug. 19, 2021

(30) Foreign Application Priority Data

Jun. 18, 2019    (CN) .......................... 201910528155.5

(51) Int. Cl.
*G09G 3/00*  (2006.01)
*H01L 27/02*  (2006.01)
*H01L 27/12*  (2006.01)

(52) U.S. Cl.
CPC ......... *G09G 3/006* (2013.01); *H01L 27/0251* (2013.01); *H01L 27/0292* (2013.01);
(Continued)

(58) Field of Classification Search
CPC ........... G09G 3/006; G09G 2300/0426; G09G 2310/0286; H01L 27/0251; H01L 27/0292; H01L 27/124; H01L 27/1255
See application file for complete search history.

(56) References Cited

U.S. PATENT DOCUMENTS 9,810,932 B2 * 11/2017 Xu ............................ G09G 3/36
11,296,125 B2 * 4/2022 Huang ................... G02F 1/1362
(Continued)

FOREIGN PATENT DOCUMENTS

CN    204991708 U    1/2016
CN    106652942 A    5/2017
(Continued)

OTHER PUBLICATIONS

First office action of Chinese application No. 201910528155.5 issued on Apr. 9, 2021.

*Primary Examiner* — Patrick N Edouard
*Assistant Examiner* — Eboni N Giles
(74) *Attorney, Agent, or Firm* — Lippes Mathias LLP

(57) ABSTRACT

An array substrate and a testing method thereof are provided. The array substrate includes a gate driving circuit, a plurality of clock signal lines and a plurality of testing terminals, wherein a number of the clock signal lines is greater than a number of the testing terminals; the plurality of clock signal lines are connected to the gate driving circuit and the plurality of testing terminals, and at least two clock signal lines are connected to a same testing terminal; and the plurality of testing terminals are configured to connect to a testing device.

19 Claims, 9 Drawing Sheets

(52) U.S. Cl.
CPC ........ *H01L 27/124* (2013.01); *H01L 27/1255* (2013.01); *G09G 2300/0426* (2013.01); *G09G 2310/0286* (2013.01)

(56) References Cited

U.S. PATENT DOCUMENTS

| | | | |
|---|---|---|---|
| 2015/0077319 A1* | 3/2015 | Yao | G11C 19/28 345/100 |
| 2019/0206293 A1 | 7/2019 | Tian et al. | |
| 2021/0209995 A1* | 7/2021 | Feng | G11C 19/28 |
| 2021/0366401 A1* | 11/2021 | Feng | G11C 19/28 |
| 2022/0101796 A1* | 3/2022 | Feng | G09G 3/3266 |
| 2022/0262315 A1* | 8/2022 | Feng | G09G 3/3266 |

FOREIGN PATENT DOCUMENTS

| | | |
|---|---|---|
| CN | 206235796 U | 6/2017 |
| CN | 107967888 A | 4/2018 |
| CN | 108873525 A | 11/2018 |
| CN | 110246443 A | 9/2019 |
| KR | 20090048764 A | 5/2009 |

\* cited by examiner

ARRAY SUBSTRATE AND TESTING METHOD THEREOF

CROSS-REFERENCE TO RELATED APPLICATIONS

The present disclosure is a 371 of PCT Application No. PCT/CN2020/094009 filed on Jun. 2, 2020, which claims priority to Chinese Patent Application No. 201910528155.5, filed on Jun. 18, 2019 and entitled "ARRAY SUBSTRATE AND TESTING METHOD THEREOF", the entire contents of which are incorporated herein by reference.

TECHNICAL FIELD

The present disclosure relates to the field of display technologies, and in particular, to an array substrate and a testing method thereof.

BACKGROUND

The gate driver on array (GOA) technology may integrate a gate driving circuit on an array substrate, to decrease a size of the bezel of a display device. The gate driving circuit may be connected with a plurality of clock signal lines and pixel units, and may control the operation of the pixel units based on the clock signals provided by the clock signal lines.

In the related art, to ensure the production yield, a performance test, such as an array test (AT), may be performed on the gate driving circuits before the factory shipment. During the test, the array substrate may be provided with a plurality of testing terminals, each connected to one pin of a testing device and one clock signal line respectively. The testing device may provide clock signals to each clock signal line through the respective testing terminals.

SUMMARY

The present disclosure provides an array substrate and a testing method thereof. The technical solutions are as follows.

In one aspect, an array substrate is provided. The array substrate includes a gate driving circuit, a plurality of clock signal lines and a plurality of testing terminals, wherein a number of the clock signal lines is greater than a number of the testing terminals;
the plurality of clock signal lines are connected to the gate driving circuit and the plurality of testing terminals, and at least two clock signal lines are connected to a same testing terminal; and
the plurality of testing terminals are configured to connect to a testing device.

Optionally, the gate driving circuit includes a plurality of cascade-connected shift register units, and the plurality of clock signal lines include a plurality of first clock signal lines and a plurality of second clock signal lines, wherein each shift register unit is configured to output a clock signal provided by the first clock signal line to a switching output terminal connected to a first gate line and output a clock signal provided by the second clock signal line to a detecting output terminal connected to a second gate line; wherein the plurality of testing terminals includes a plurality of first testing terminals and at least one second testing terminal;
at least two of the plurality of first clock signal lines are connected to a same first testing terminal; and
at least two of the plurality of second clock signal lines are connected to a same second testing terminal.

Optionally, the plurality of testing terminals includes one second testing terminal, wherein all of the plurality of second clock signal lines are connected to the second testing terminal.

Optionally, at least two adjacent first clock signal lines are connected to the same first testing terminal.

Optionally, every two of the plurality of first clock signal lines are connected to the same first testing terminal.

Optionally, the plurality of clock signal lines further includes a plurality of third clock signal lines; either odd-numbered-stage shift register units or even-numbered-stage shift register units in the plurality of cascade-connected shift register units are connected to the third clock signal lines, so as to output a clock signal provided by the third clock signal lines to a shift output terminal; and
each of the plurality of third clock signal lines is connected to one of the first testing terminals, and each third clock signal line is connected to a different first testing terminal than other third clock signal lines.

Optionally, each of the third clock signal lines is directly connected to one of the first testing terminals; and the at least two first clock signal lines are connected to one of the third clock signal lines.

Optionally, the at least two first clock signal lines are directly connected to the same first testing terminal; and each of the third clock signal lines is connected to one of the at least two first clock signal lines.

Optionally, the plurality of clock signal lines includes ten first clock signal lines, ten second clock signal lines and five third clock signal lines.

Optionally, each cascaded shift register unit that is connected to the third clock signal lines has a shift output terminal connected to input terminals of two stages of shift register units, and the two stages of shift register units are adjacent in stage. Optionally, each of the shift register units includes a shift sub-circuit, a first output transistor and a second output transistor; wherein
the shift sub-circuit is connected to a pull-up node;
the first output transistor has a gate connected to the pull-up node, a first electrode connected to one of the first clock signal lines, and a second electrode connected to the switching output terminal; and
the second output transistor has a gate connected to the pull-up node, a first electrode connected to one of the second clock signal lines, and a second electrode connected to the detecting output terminal.

Optionally, the array substrate further includes a pull-down power line; wherein each of the shift register units further includes a first pull-down transistor and a second pull-down transistor; the shift sub-circuit is further connected to a pull-down node;
the first pull-down transistor has a gate connected to the pull-down node, a first electrode connected to the pull-down power line, and a second electrode connected to the switching output terminal; and
the second pull-down transistor has a gate connected to the pull-down node, a first electrode connected to the pull-down power line, and a second electrode connected to the detecting output terminal.

Optionally, in the at least two clock signal lines connected to a same testing terminal, one clock signal line is directly connected to the testing terminal, and the at least two clock signal lines are connected sequentially.

Optionally, in the at least two clock signal lines connected to a same testing terminal, one target clock signal line is directly connected to the testing terminal, and any of the at least two clock signal lines other than the target clock signal line is connected to the target clock signal line.

Optionally, the array substrate further includes a plurality of pixel circuits, each of the pixel circuits including a switching transistor, a driving transistor, a detecting transistor and a storage capacitor, wherein the switching transistor has a gate connected to the first gate line, a first electrode connected to a data signal terminal, and a second electrode connected to a gate of the driving transistor;

the driving transistor has a first electrode connected to a direct current power terminal, and a second electrode connected to one end of a light-emitting element;

the detecting transistor has a gate connected to the second gate line, a first electrode connected to one end of the light-emitting element and a second electrode connected to a detecting signal line; and the storage capacitor has one end connected to the gate of the driving transistor and the other end connected to one end of the light-emitting element.

In another aspect, a method of testing an array substrate is provided. The method is applied to the array substrate according to any of the above aspect, and the method includes:

connecting a testing device to each of the testing terminals of the array substrate respectively;

providing clock signals to a plurality of clock signal lines of the array substrate through each of the testing terminals; and acquiring driving signals applied to light-emitting elements by respective pixel circuits of the array substrate.

Optionally, the plurality of clock signal lines includes a plurality of first clock signal lines, a plurality of second clock signal lines and a plurality of third clock signal lines, and the plurality of testing terminals includes a plurality of first testing terminals and one second testing terminal, wherein every two first clock signal lines are connected to a same first testing terminal, the plurality of second clock signal lines are connected to one second testing terminal, and each of the third clock signal lines is connected to one of the first testing terminals; and said providing clock signals to the plurality of clock signal lines of the array substrate through each of testing terminals includes:

sequentially providing clock signals to the plurality of first clock signal lines and the plurality of third clock signal lines through the first testing terminals; and providing a clock signal at effective potential to the plurality of second clock signal lines through the second testing terminal.

Optionally, a duty ratio of the clock signals provided to the plurality of first clock signal lines and the plurality of third clock signal lines is 2/5, and an interval of rising edges of clock signals provided to every two adjacent third clock signal lines is 1/5 of a cycle of the clock signal.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
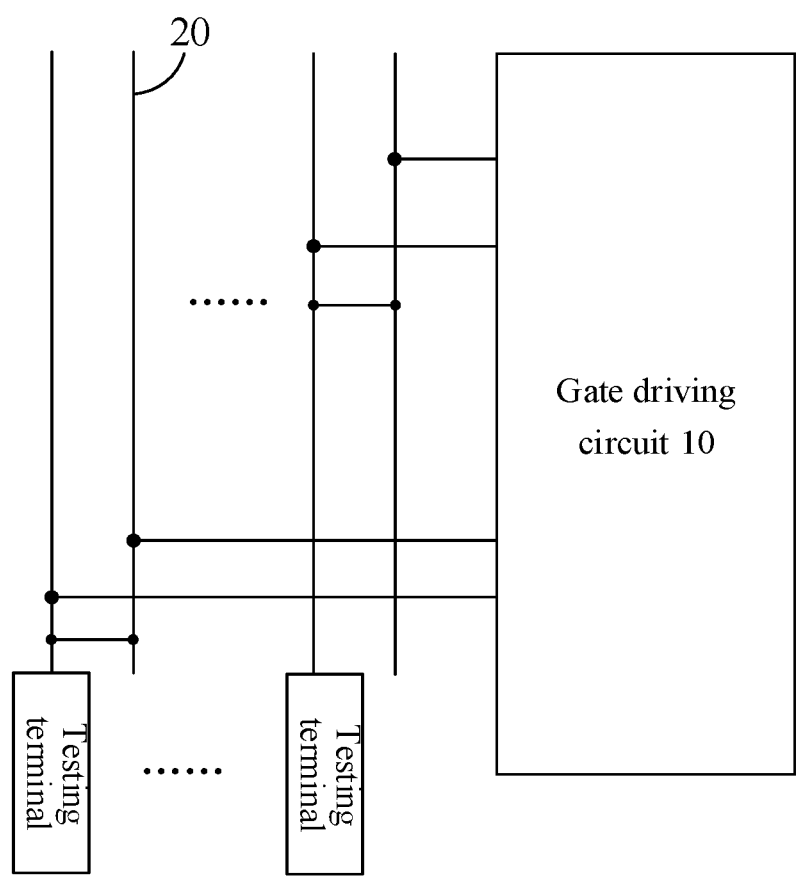
FIG. 1 is a schematic structural diagram of an array substrate according to an embodiment of the present disclosure.

For clearer descriptions of the objectives, technical solutions and advantages in the present disclosure, embodiments of the present disclosure are further described in detail below in combination with the accompanying drawings.

Transistors used in all embodiments of the present disclosure may be thin film transistors, field-effect transistors or other devices having the same properties, and based on the functions in a circuit, the transistors used in the embodiments of the present disclosure are mainly switching transistors. As a source and a drain of the switching transistor used herein are symmetrical, the source and the drain are interchangeable. In the embodiments of the present disclosure, the source is referred to as the first electrode and the drain is referred to as the second electrode. Based on the configuration shown in the figure, in a transistor, the middle end is specified as the gate, the signal input terminal is specified as the source, and the signal output terminal is specified as the drain. In addition, the switching transistors used in the embodiments of the present disclosure may include either P-type switching transistors or N-type switching transistors. The P-type switching transistor is turned on when the gate is at a low level and is turned off when the gate is at a high level; while the N-type switching transistor is turned on when the gate is at a high level and is turned off when the gate is at a low level.

To ensure the production yield, array substrates need to be detected by an AT testing device before the factory shipment and display panels need to be detected by a cell testing (CT) device. The array substrate generally includes a clock signal line, a gate driving circuit and a plurality of rows of pixel circuits arranged in an array. Each row of pixel circuits may be connected to at least two gate lines and the gate driving circuit may be connected to the clock signal line and the gate line. The gate driving circuit may output a clock signal provided by the clock signal line, as a gate driving signal, to the gate line, the gate line may output the gate driving signal to the pixel circuit, and the pixel circuit may operate under the driving of the gate driving signal.

Parasitic capacitances and parasitic resistances may easily occur at crossings where the signal lines intersect and the parasitic capacitances and parasitic resistances may cause a delay in signal transmission. Therefore, in order to alleviate the influence of signal delay, the gate driving circuit may be connected to a plurality of clock signal lines, and for the display panel having a high resolution, the number of clock signal lines to which the gate driving circuit needs to be connected may be greater. In the related art, during the testing, each clock signal line needs to be connected to one testing terminal and each testing terminal needs to be connected to one pin on the testing device, therefore, when there are a large number of clock signal lines, the number of testing terminals required to be disposed on the array substrate is relatively large. Correspondingly, the number of pins required to be included in the testing device is relatively large, and the number of the testing terminals disposed on the array substrate may even exceed the limit of the number of pins which can be disposed on the testing device.

FIG. 1 is a structural diagram of an array substrate according to an embodiment of the present disclosure. As shown in FIG. 1, the array substrate may include a gate driving circuit 10, a plurality of clock signal lines 20 and a plurality of testing terminals 30. A number of the clock signal lines 20 may be greater than a number of the testing terminals 30.

In the embodiment of the present disclosure, the plurality of clock signal lines 20 may be connected to the gate driving circuit 10 and the plurality of testing terminals 30 respectively and at least two clock signal lines 20 may be connected to a same testing terminal 30.

The plurality of testing terminals 30 may be configured to connect to a testing device. In addition, each testing terminal 30 may be connected to one pin of the testing device and each testing terminal 30 is connected to different pins. In some embodiments, the testing device may be an AT device for performing an AT test or a CT device for performing a CT test.

Exemplarily, referring to FIG. 1, every two of the plurality of first clock signal lines 20 are connected to a same testing terminal 30. If the array substrate includes ten clock signal lines 20, then only five testing terminals 30 are required to be disposed on the array substrate. In the related art, however, since each clock signal line is connected to one testing terminal, ten testing terminals are required to be disposed on the array substrate in the related art. Compared with the number of the testing terminals required to be disposed on the array substrate in the related art, the number of the testing terminals required to be disposed on the array substrate according to the embodiment of the present disclosure is decreased by half. Correspondingly, compared with the number of the pins required to be included in the testing device connected to the testing terminals on the array substrate in the related art, the number of the pins required to be included in the testing device connected to the testing terminals on the array substrate according to the embodiment of the present disclosure is decreased by half. Thus, the production cost can be saved.

In summary, in the array substrate provided by the embodiment of the present disclosure, the array substrate includes the plurality of clock signal lines and the plurality of testing terminals. Since at least two of the plurality of clock signal lines may be connected to a same testing terminal, the number of the testing terminals required to be disposed on the array substrate according to the embodiment of the present disclosure is relatively small compared to the situation in the related art that one clock signal line is connected to one testing terminal. Correspondingly, the number of the pins required to be contained in the testing device connected to the testing terminals on the array substrate according to the embodiment of the present disclosure may be relatively small. Therefore, the testing device has a relatively low production cost and a relatively small volume.

Figure 2:
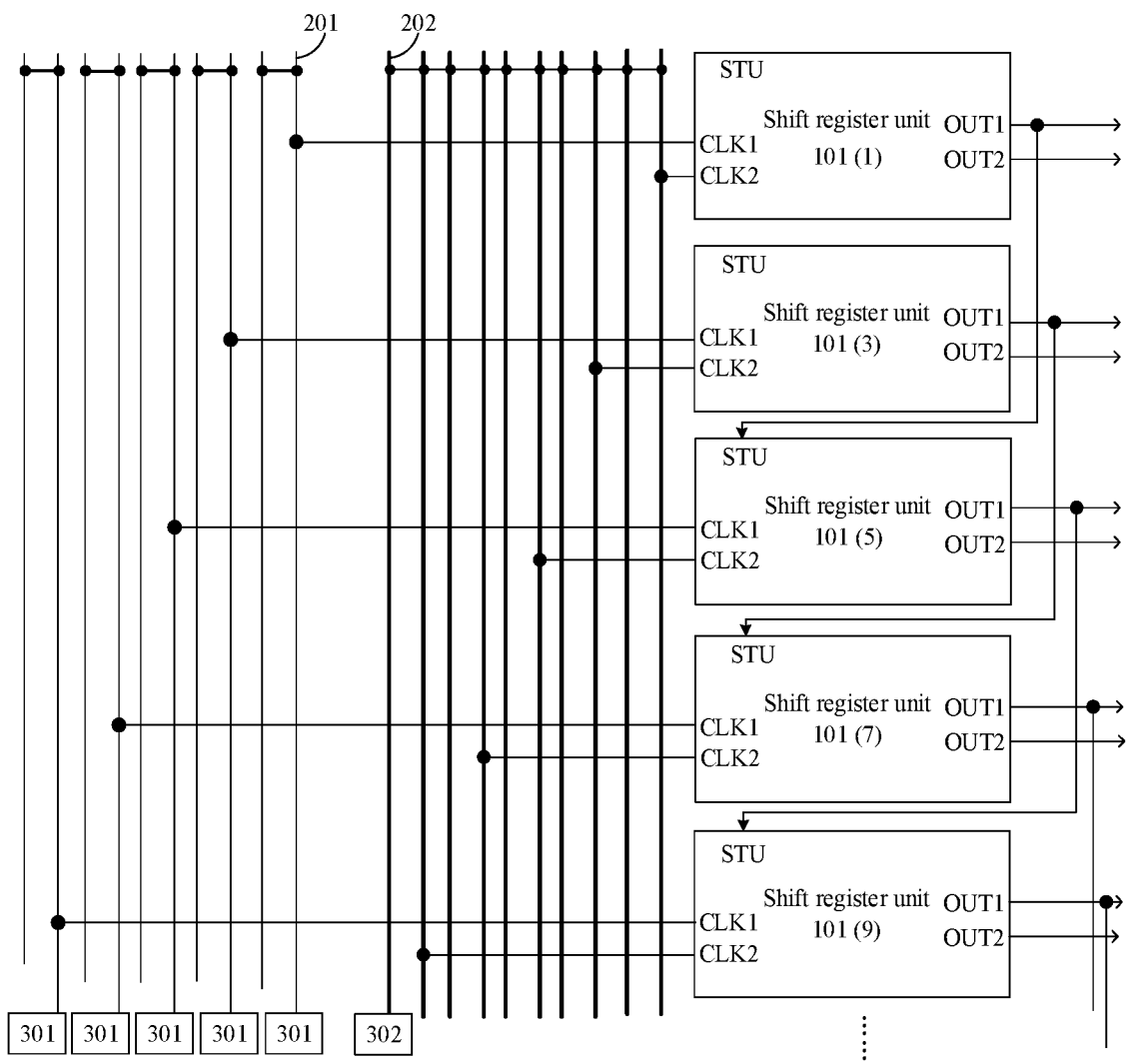
FIG. 2 is a schematic structural diagram of another array substrate according to an embodiment of the present disclosure.

FIG. 2 is a schematic structural diagram of another array substrate according to an embodiment of the present disclosure. As shown in FIG. 2, the gate driving circuit 10 may include a plurality of cascade-connected shift register units 101. The plurality of clock signal lines 20 may include a plurality of first clock signal lines 201 and a plurality of second clock signal lines 202.

Each shift register unit 101 may be configured to output the clock signal provided by the first clock signal line 201 to a switching output terminal OUT1 connected to the first gate line and output a clock signal provided by the second clock signal line 202 to a detecting output terminal OUT2 connected to the second gate line. The first gate line may be configured to provide a gate driving signal to a switching transistor in a pixel circuit included in the array substrate, and the second gate line may be configured to provide a gate driving signal to a detecting transistor in the pixel circuit.

Figure 3:
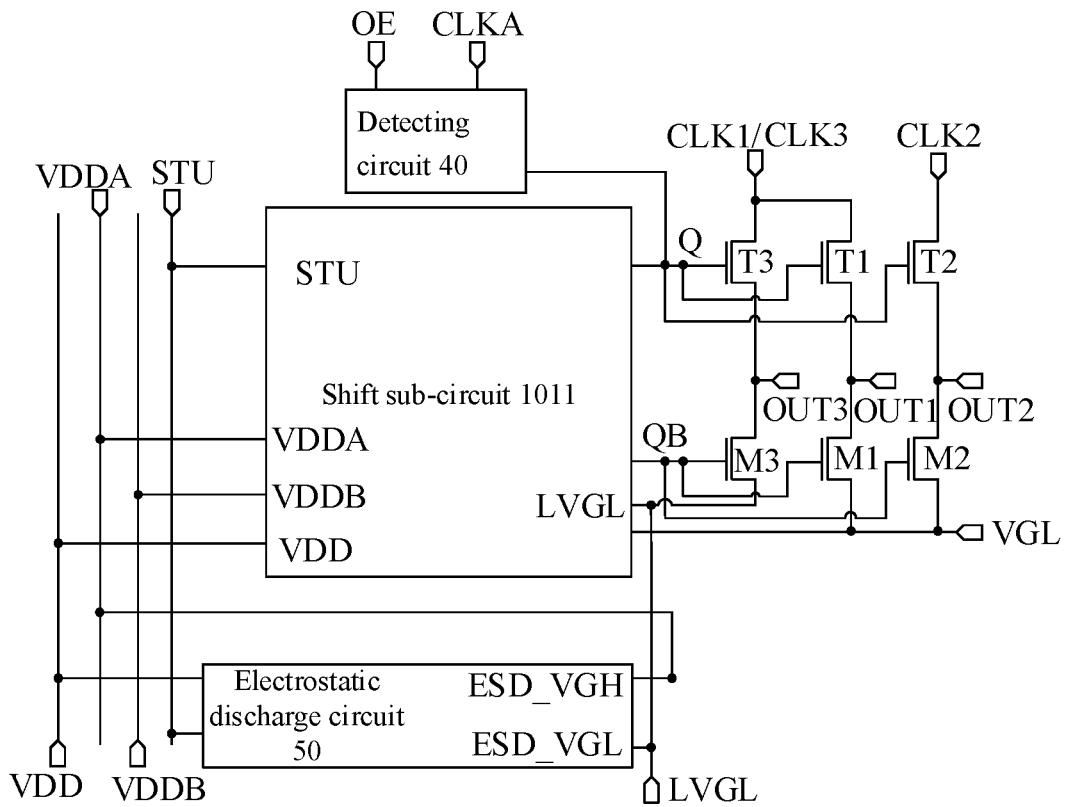
FIG. 3 is a partial schematic structural diagram of a shift register unit according to an embodiment of the present disclosure.

Optionally, FIG. 3 is a partial schematic structural diagram of a shift register unit according to an embodiment of the present disclosure. Referring to FIG. 2 and FIG. 3, it can be seen that each shift register unit 101 may include a shift sub-circuit 1011, a first output transistor T1, a second output transistor T2, an input terminal STU, a first clock signal terminal CLK1 and a second clock signal terminal CLK2.

Referring to FIG. 3, the shift sub-circuit 1011 may be connected to the input terminal STU and a pull-up node Q respectively. The gate of the first output transistor T1 may be connected to the pull-up node Q, a first electrode of the first output transistor T1 may be connected to the first clock signal terminal CLK1 and a second electrode of the first output transistor T1 may be connected to the switching output terminal OUT1. A gate of the second output transistor T2 may be connected to the pull-up node Q, a first electrode of the second output transistor T2 may be connected to the second clock signal terminal CLK2 and a second electrode of the second output transistor T2 may be connected to the detecting output terminal OUT2. Referring to FIG. 2, the first clock signal line 201 may be connected to the first clock signal terminal CLK1 in the shift register unit, and the second clock signal line 202 may be connected to the second clock signal terminal CLK2 in the shift register unit.

Optionally, referring to FIG. 2, the switching output terminal OUT1 may also be connected to the input terminals STU of the other shift register units 101. For example, the switching output terminal OUT1 of the first-stage shift register unit 101(1) in FIG. 2 may be connected to the input terminal STU of the fifth-stage shift register unit 101(5) and the input terminal STU of the sixth-stage shift register unit (not shown in FIG. 2).

In the embodiment of the present disclosure, when the pull-up node Q is at an effective potential, each shift register unit 101 may output, to the switching output terminal OUT1 through the first output transistor T1, the clock signal provided to the first clock signal terminal CLK1 by the first clock signal line 201. When the pull-up node Q is at the effective potential, each shift register unit 101 may output, to the detecting output terminal OUT2 through the second output transistor T2, the clock signal provided to the second clock signal terminal CLK2 by the second clock signal line 202.

Optionally, referring to FIG. 2, the plurality of testing terminals 30 may include a plurality of first testing terminals 301 and at least one second testing terminal 302. At least two of the plurality of first clock signal lines 201 may be connected to a same first testing terminal 301, and each first testing terminal 301 may be connected to at least one first clock signal line 201. At least two of the plurality of second clock signal lines 202 are connected to a same second testing terminal 302.

Exemplarily, referring to FIG. 2, the plurality of clock signal lines 20 includes ten first clock signal lines 201 and ten second clock signal lines 202. The plurality of testing terminals 30 includes five first testing terminals 301 and 1 second testing terminal 302. Every two of the ten first clock signal lines 201 are connected to a same first testing terminal 301. The ten second clock signal lines 202 are all connected to one second testing terminal 302.

Figure 4:
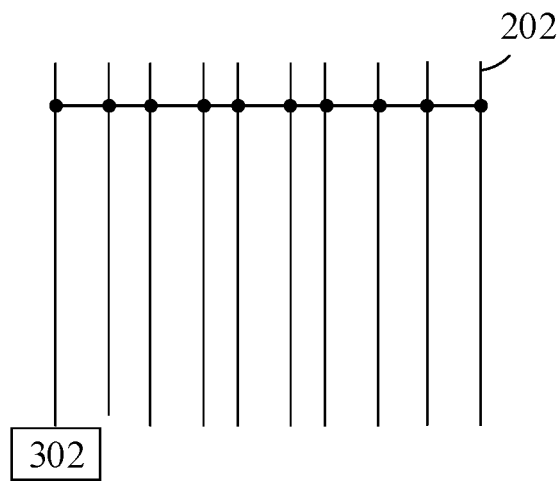
FIG. 4 is a schematic diagram showing a connection between second clock signal lines and a testing terminal according to an embodiment of the present disclosure.

Optionally, FIG. 4 is a schematic diagram showing a connection between second clock signal lines and a testing terminal according to an embodiment of the present disclosure. Referring to FIG. 2 and FIG. 4, it can be seen that, the plurality of testing terminals may only include one second testing terminal 302, and all of the plurality of second clock signal lines 202 may be connected to the second testing terminal 302.

Referring to FIG. 3, it can be seen that the gate of the second output transistor T2 connected to the detecting output terminal OUT2 is connected to the pull-up node Q. That is, the operating state of the second output transistor T2 is controlled by the potential of the pull-up node Q. The potential of the pull-up node Q is controlled by the signal output by the switching output terminal OUT1 of the shift register unit 101 which is cascade-connected with the pull-up node Q.

In the embodiment of the present disclosure, the clock signals at effective potentials can be sequentially provided by the plurality of first testing terminals 301 to the respective first signal lines 201, and correspondingly, the respective shift register units 101 may sequentially output the clock signals at effective potentials to the respective switching output terminals OUT1, such that the pull-up node Q of the respective register units 101 may be at an effective potential sequentially and thus the second output transistors T2 in the respective shift register units 101 can be controlled to be turned on sequentially. Therefore, by arranging one second testing terminal 302 to connect to all the second clock signal lines 202 and providing signals at effective potentials to all the second clock signal lines 202 by the one second testing terminal 302, the respective shift register units may sequentially output signals at an effective potential to each detecting output terminal OUT2, that is, each shift register unit may sequentially output the gate driving signals at an effective potential to the plurality of second gate lines. Correspondingly, the detecting transistors of the plurality of pixel circuits in the same column can be turned on sequentially. Therefore, the number of the testing terminals 30 required to be disposed on the array substrate can be further reduced while ensuring the normal operation of the array substrate.

Optionally, in the embodiment of the present disclosure, at least two adjacent first clock signal lines 201 may be connected to a same first testing terminal 301.

For example, referring to FIG. 2, every two adjacent first clock signal lines 201 may be connected to one first testing terminal 301. By arranging at least two adjacent first clock signal lines 201 to be connected to the same one first testing terminal 301, the wiring process can be simplified while reducing the number of the testing terminals required to be disposed.

Figure 5:
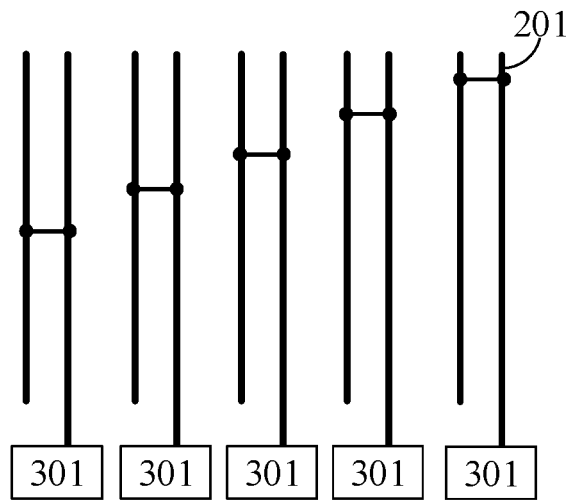
FIG. 5 is a schematic diagram showing a connection between first clock signal lines and testing terminals according to an embodiment of the present disclosure.

Optionally, FIG. 5 is a schematic diagram showing an optional connection between first clock signal lines and first testing terminals according to an embodiment of the present disclosure. Referring to FIG. 2 and FIG. 5, it can be seen that every two of the plurality of first clock signal lines 201 can be connected to a same one first testing terminal 301.

As each shift register unit 101 outputs the clock signal provided by the first clock signal line 201 to the switching output terminal OUT1 connected with the first gate line, when every two first clock signal lines 201 are connected to one first testing terminal 301, the clock signals provided by the two first clock signal lines 201 connected with the same first testing terminal 301 are exactly identical. Correspondingly, the clock signals output by two shift register units 101 connected to the two first clock signal lines 201 to the switching output terminals OUT1 of the two shift register units are exactly identical. In addition, as the first gate line is configured to provide the gate driving signal for the switching transistor, the two first gate lines can be enabled to simultaneously output gate driving signals to the switching transistors in two rows of pixel circuits. That is, two rows of pixel units can be driven at the same time. Thus, under the condition that the number of testing terminals required to be disposed on the array substrate is reduced, the display effect and resolution of the display device can still be ensured when the array substrate is tested.

Figure 6:
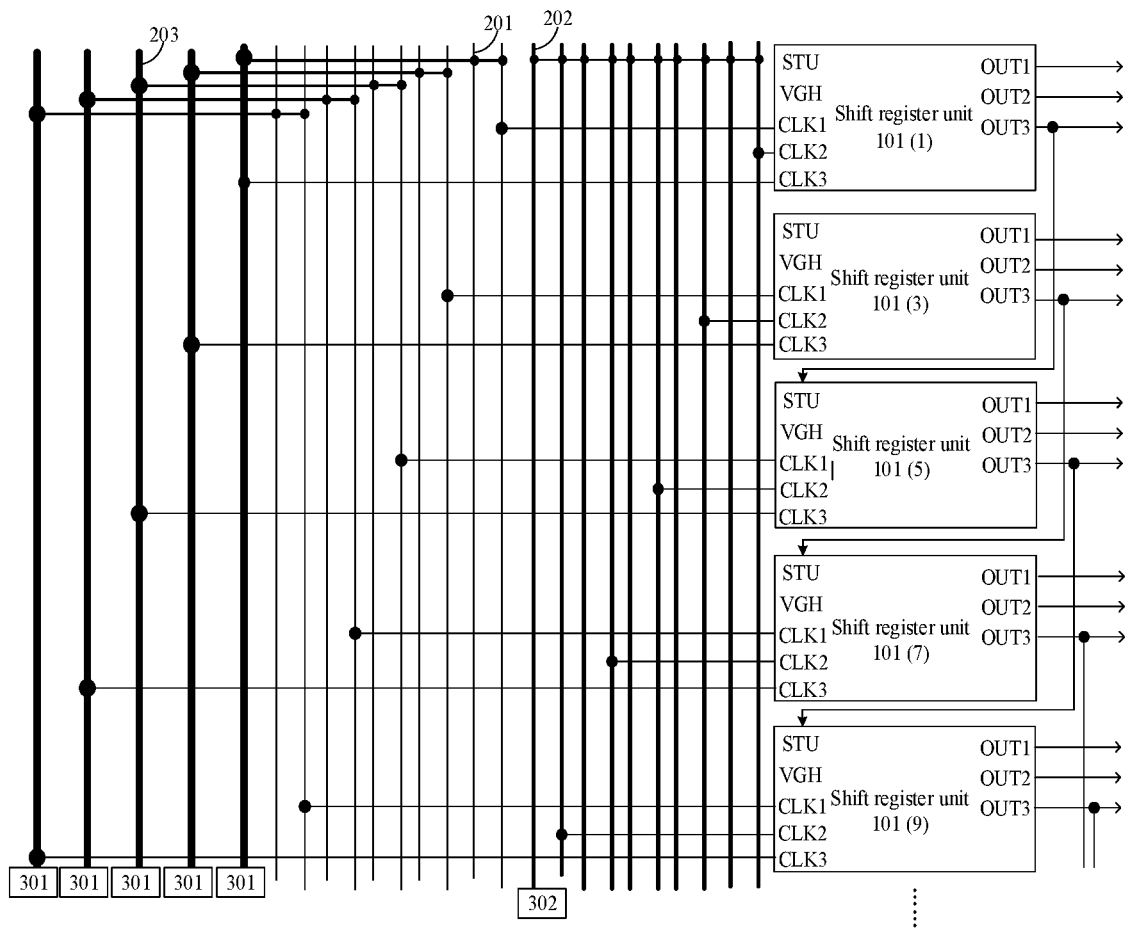
FIG. 6 is a schematic structural diagram of still another array substrate according to an embodiment of the present disclosure.

FIG. 6 is a schematic structural diagram of still another array substrate according to an embodiment of the present disclosure. As shown in FIG. 6, the plurality of clock signal lines 20 may further include a plurality of third clock signal lines 203. Either odd-numbered-stage shift register units or even-numbered-stage shift register units in the plurality of cascade-connected shift register units 101 may be connected to one third clock signal line 203, and can output a clock signal provided by the third clock signal line 203 to a shift output terminal OUT3.

Optionally, referring to FIG. 3 and FIG. 6, each odd-numbered-stage shift register unit 101 (or each even-numbered-stage shift register unit 101) connected to the third clock signal line 203 may further include a third output transistor T3 and a third clock signal terminal CLK3. The gate of the third output transistor T3 may be connected to the pull-up node Q, the first electrode of the third output transistor T3 may be connected to the third clock signal terminal CLK3, and the second electrode of the third output transistor T3 may be connected to the shift output terminal OUT3. The shift output terminal OUT3 may be connected to the input terminals STU of two other stages of shift register units 101 and the two stages of shift register units 101 connected to the shift output terminal OUT3 are two shift register units 101 adjacent in stage. For example, the shift output terminal OUT3 of the first-stage shift register unit 101(1) shown in FIG. 6 may be connected to the input terminal STU of the fifth-stage shift register unit 101(5) and the input terminal STU of the sixth-stage shift register unit (not shown in the figure).

In addition, the shift output terminal OUT3 may be also connected to reset terminals STD of two other shift register units 101 that are adjacent in stage. For example, the shift output terminal OUT3 of the seventh-stage shift register unit 101(7) shown in FIG. 6 may be connected to the reset terminal STD of the first-stage shift register unit 101(1) and the reset terminal STD of the second-stage shift register unit 101(2).

Referring to FIG. 3, the third clock signal line 203 may be connected to the third clock signal terminal CLK3. When the pull-up node Q is at an effective potential, each odd-numbered-stage or even-numbered-stage shift register unit 101 connected to this third clock signal line 203 may output, to the shift output terminal OUT3 through the third output transistor T3, the clock signal provided for the third clock signal terminal CLK3 by the third clock signal line 203.

Optionally, in the embodiment of the present disclosure, each of the plurality of third clock signal lines 203 may be connected to one of the first testing terminals 301 and each third clock signal line 203 may be connected to a different first testing terminal 301 than other third clock signal lines 301.

Exemplarily, referring to FIG. 6, the plurality of clock signal lines 20 include five third clock signal lines 203. Each of the five third clock signal lines 203 may be connected to one first testing terminal 301.

As the odd-numbered-stage or even-numbered-stage shift register unit 101 may output the clock signal provided by the third clock signal line 203 to the shift output terminal OUT3, and may output the clock signal provided by the first clock signal line 201 to the switching output terminal OUT1 connected to the first gate line, the signals output by the switching output terminal OUT1 and the shift output terminal OUT3 can be the same. Correspondingly, the timing of the clock signals provided by the third clock signal line 203 and the first clock signal line 201 can be the same. Therefore, at least two first clock signal lines 201 and each third clock signal line 203 may be disposed to be connected to the same one first testing terminal 301, thereby further reducing the number of the testing terminals 30 required to be disposed on the array substrate while ensuring the normal operation of the gate driving circuit.

As the first clock signal line 201 and the third clock signal line 203 are both connected to the first testing terminal 301, referring to FIG. 3, the first clock signal terminal CLK1 and the third clock signal terminal CLK3 in each odd-numbered-stage (or even-numbered-stage) shift register unit 101 may be the same clock signal terminal. However, each odd-numbered-stage (or even-numbered-stage) shift register unit 101 outputs, through the first output transistor T1 to the switching output terminal OUT1 connected to the first gate line, the clock signal provided by the first clock signal terminal CLK1 thereof, and outputs, through the third output transistor T3 to the input terminal STU of another shift register unit 101 to which the shift register unit 101 is cascade-connected, the clock signal provided by the third clock signal terminal CLK3 thereof. Therefore, in order to avoid mutual interference between the signal output to the switching output terminal OUT1 and the signal output to the other stages of shift register units 101, i.e., to ensure the operating stability of the first output transistor T1 and the third output transistor T3, the first clock signal terminal CLK1 and the third clock signal terminal CLK3 may be different clock signal terminals in actual products left the factory.

Optionally, referring to FIG. 3 and FIG. 6, each shift register unit 101 may further include high-level power terminals VGH, VDDA, VDDB and VDD and low-level power terminals VGL and LVGL. The respective terminals may be connected to the corresponding signal lines. For example, referring to FIG. 3, the high-level power terminal VDDA is connected to the signal line VDDA. Each shift register unit 101 may further include a pull-down node QB and pull-down transistors M1 and M2. The odd-numbered-stage (or even-numbered-stage) shift register unit 101 connected to the third clock signal line 203 may further include a pull-down transistor M3. Gates of the pull-down transistors M1 to M3 may be all connected to the pull-down node QB, first electrodes of the pull-down transistors M1 and M2 may be both connected to the low-level power terminal VGL, and the low-level power terminal VGL may be connected to a pull-down power line for providing an ineffective potential. The first electrode of the pull-down transistor M3 may be connected to the low-level power terminal LVGL, the second electrode of the pull-down transistor M1 may be connected to the switching output terminal OUT1, the second electrode of the pull-down transistor M2 may be connected to the detecting output terminal OUT2 and the first electrode of the pull-down transistor M3 may be connected to the shift output terminal OUT3.

When the pull-down node QB is at an effective potential, the pull-down transistor M1 may output, to the switching output terminal OUT1, a signal at an ineffective potential (such as a low-level signal) provided by the low-level power terminal VGL, thereby resetting the switching output terminal OUT1. When the pull-down node QB is at an effective potential, the pull-down transistor M2 may output, to the detecting output terminal OUT2, a signal at an ineffective potential (such as a low-level signal) provided by the low-level power terminal VGL, thereby resetting the detecting output terminal OUT2. When the pull-down node QB is at an effective potential, the pull-down transistor M3 may output, to the shift output terminal OUT3, a signal at an ineffective potential (such as a low-level signal) provided by the low-level power terminal LVGL, thereby resetting the shift output terminal OUT3.

Optionally, referring to FIG. 3, it can be further seen that the array substrate further includes a plurality of detecting circuits 40 (FIG. 3 only schematically shows one detecting circuit 40) and an electrostatic discharge circuit 50. Each detecting circuit 40 may be connected to the pull-up node Q, a clock signal terminal CLKA and an enable signal terminal OE of one shift register unit 101. The detecting circuit 40 may be configured to control the timing of the shift register unit 101 during a blanking period.

The electrostatic discharge circuit 50 may be connected to the plurality of clock signal lines 20 and an electrostatic discharging line respectively and configured to discharge static electricity on the plurality of clock signal lines 20, thereby achieving electrostatic protection. Of course, in addition to the clock signal lines 20, the electrostatic discharge circuit 50 may be connected to other signal lines. For example, referring to FIG. 3, in the electrostatic discharge circuit 50, a power terminal ESD_VGH may be connected to the signal line VDDA and a power terminal ESD_VGL may be connected to the low-level power terminal LVGL. The electrostatic discharge circuit 50 may be also connected to a signal line VDD and a signal line VDDB. The signal line connected to the low-level power terminal LVGL is the electrostatic discharging line.

Optionally, the embodiment of the present disclosure provides two modes of connecting the first clock signal line 201 and the third clock signal line 203 to the first testing terminal 301.

Figure 7:
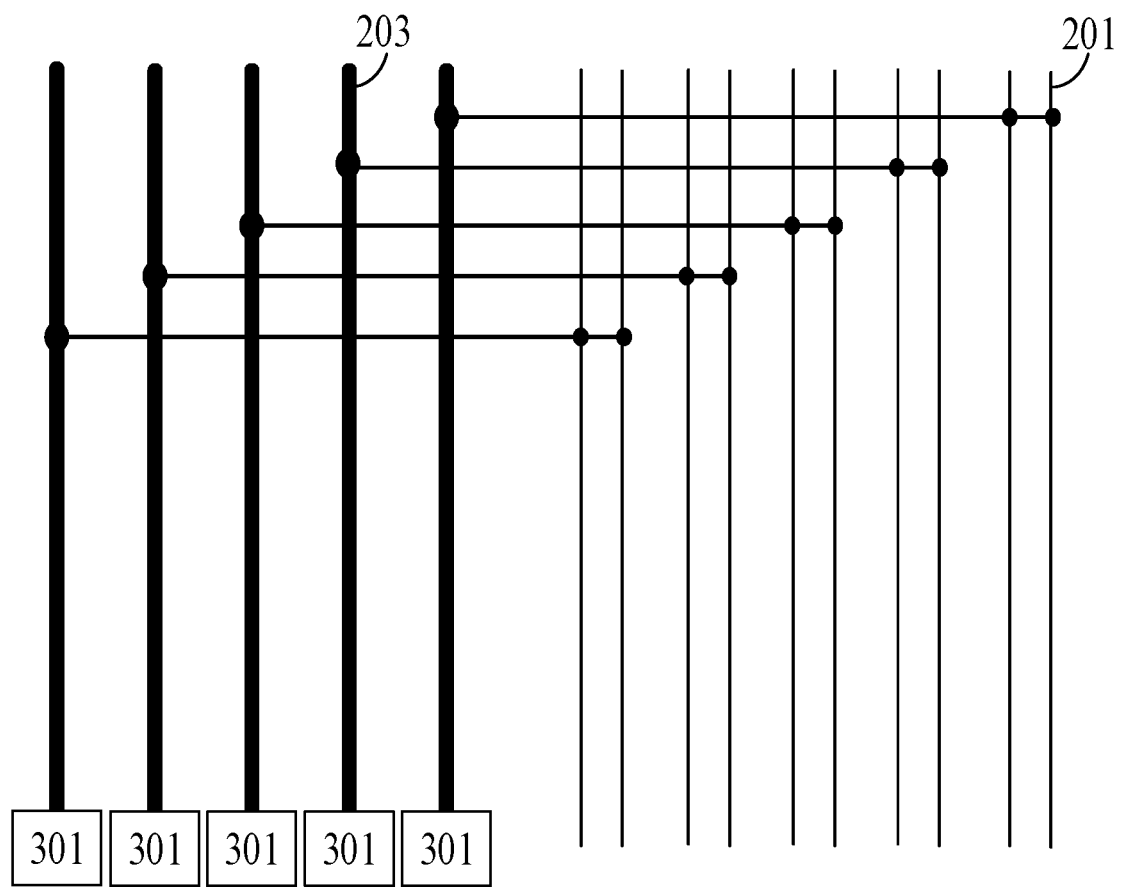
FIG. 7 is a schematic diagram showing a connection between first clock signal lines and first testing terminals as well as a connection between third clock signal lines and the first testing terminals according to an embodiment of the present disclosure.

As an optional implementation mode, referring to FIG. 6 and FIG. 7, each third clock signal line 203 may be directly connected to one first testing terminal 301 and at least two first clock signal lines 201 may be both connected to one third clock signal line 203. For example, on the array substrate shown in FIG. 6 and FIG. 7, every two first clock signal lines 201 are connected to one third clock signal line 203.

As shown in FIG. 6 and FIG. 7, every two first clock signal lines 201 may establish a connection through a connecting line, and only one of the two first clock signal lines 201 is directly connected to the third clock signal line 203. Of course, each of the two first clock signal lines 201 may be directly connected to one third clock signal line 203.

Figure 8:
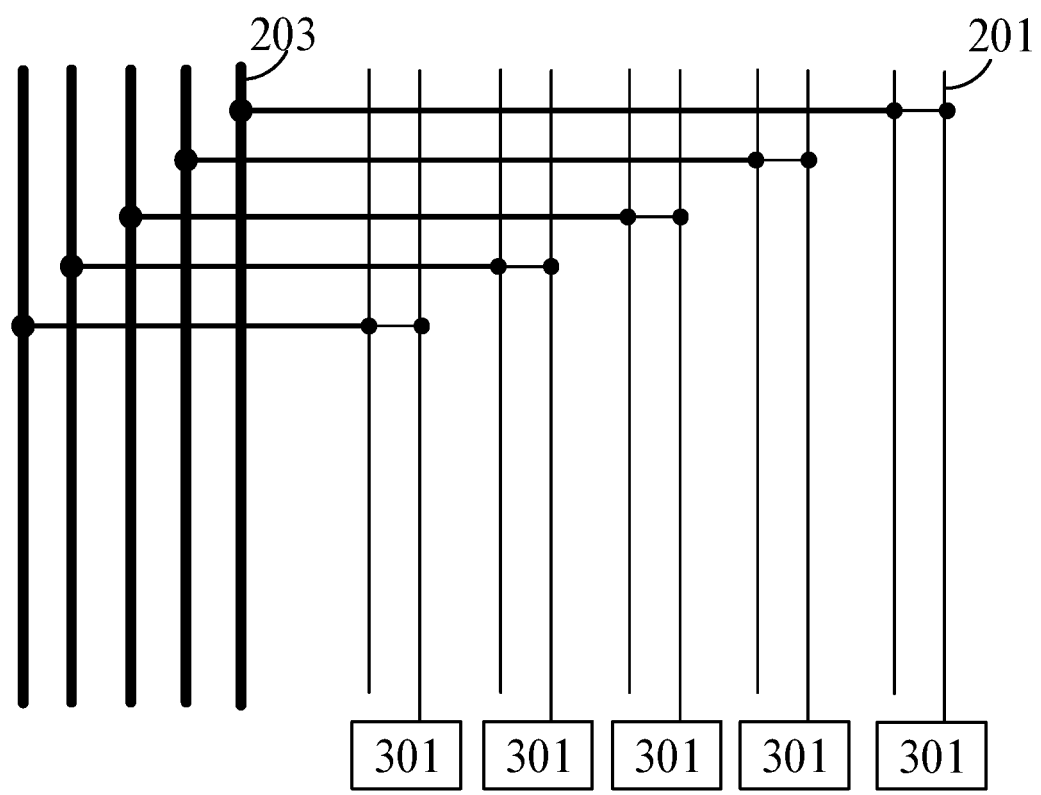
FIG. 8 is a schematic diagram showing another connection between the first clock signal lines and the first testing terminals as well as another connection between the third clock signal lines and the first testing terminals according to an embodiment of the present disclosure.

As another optional implementation mode, referring to FIG. 2 and FIG. 8, at least two first clock signal lines 201 may be directly connected to a same first testing terminal 301 and each third clock signal line 203 may be connected to one of the at least two first clock signal lines 201. For example, on the array substrate shown in FIG. 2 and FIG. 8, every two first clock signal lines 201 are directly connected to one first testing terminal 301 and each third clock signal line 203 is connected to one of the every two first clock signal lines 201.

Referring to FIG. 2 and FIG. 8, every two first clock signal lines 201 may establish a connection through a connecting line, and only one of the two first clock signal lines 201 is directly connected to the first testing terminal 301. Of course, each of the every two first clock signal lines 201 may be directly connected to the same first testing terminal 301.

Optionally, referring to FIG. 6, it can be seen that, the plurality of clock signal lines on the array substrate according to the embodiment of the present disclosure may include ten first clock signal lines 201, ten second clock signal lines 202 and five third clock signal lines 203. That is, the gate driving circuit 10 may adopt a ten-phase clock. That is, every ten stages of shift register units 101 are sequentially connected to ten first clock signal lines 201 and ten second clock signal lines 202 in one-to-one correspondence.

Figure 9:
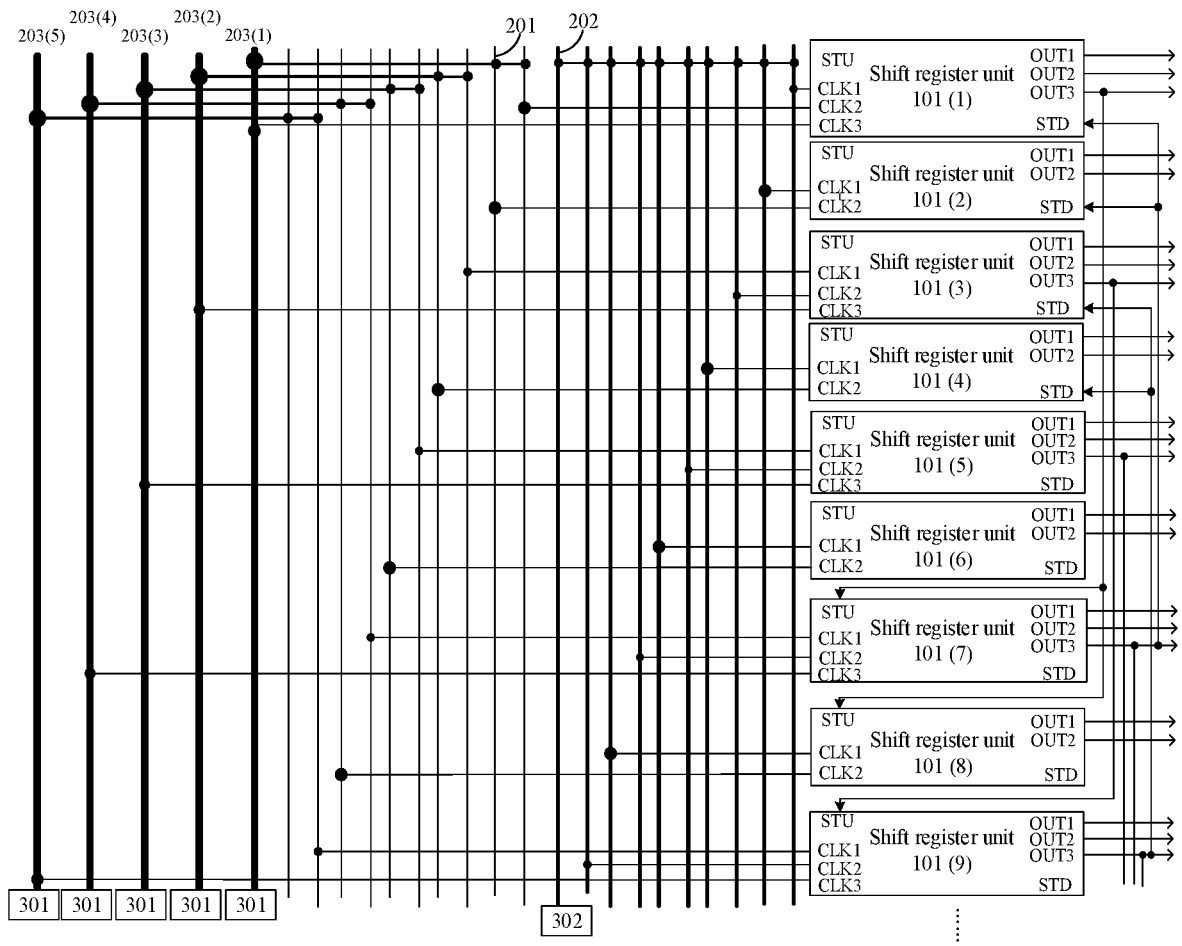
FIG. 9 is a schematic structural diagram of yet still another array substrate according to an embodiment of the present disclosure.

FIG. 2 and FIG. 6 only illustrate odd-numbered-stage shift register units 101 and the illustration is given by taking an example that the odd-numbered-stage shift register unit 101 is connected to the third clock signal line 203. The connection mode of the even-numbered-stage shift register units 101 to the clock signal lines is similar to that of the odd-numbered-stage shift register unit 101, as shown in FIG. 9. Referring to FIG. 9, it can be seen that each even-numbered-stage shift register unit 101 may be connected to one first clock signal line 201 and one second clock signal line 202 respectively. In addition, the two first clock signal lines 201 connected to the shift register units 101 of two adjacent stages may be connected to each other. For example, the first clock signal line 201 connected to the first-stage shift register unit 101(1) and the first clock signal line 201 connected to the second-stage shift register unit 101(2) may be connected to each other. The gate driving circuit 10 may also adopt a clock with other number of phases, such as a six-phase clock and an eight-phase clock.

In addition, in this connection mode, the input terminal STU of each of the first n stages of shift register units in the gate driving circuit 10 needs to be connected to one input signal line, and the input signal line is configured to provide an input signal for this stage of shift register unit 101, wherein n is an integer greater than or equal to 1. For example, referring to FIG. 9, n=6. That is, the input terminal STU of each of the first 6 stages of shift register units needs to be connected to one input signal line.

If the even-numbered-stage shift register unit 101 is connected to the third clock signal line 203, each odd-numbered-stage shift register unit 101 may be connected to one first clock signal line 201 and one second clock signal line 202 respectively. In addition, the input terminal STU of the first-stage shift register unit 101 may be connected to one input signal line, and the input signal line is configured to provide an input signal for this first-stage shift register unit 101. In this connection mode, the input terminal STU of each of the first n+1 stages of shift register units in the gate driving circuit 10 needs to be connected to one input signal line. For example, referring to FIG. 9, n=6 and the input terminal STU of each of the first 7 stages of shift register units in the gate driving circuit 10 needs to be connected to one input signal line.

Based on the above analysis, it can be seen that when the odd-numbered-stage shift register units 101 are connected to the third clock signal lines 203, the number of the shift register units 101 required to be connected to the input signal lines in the gate driving circuit 10 can be reduced.

In the embodiment of the present disclosure, when the array substrate includes ten first clock signal lines 201, ten second clock signal lines 202, and 5 third clock signal lines 203, by arranging every two first clock signal lines 201 and one third clock signal line 203 to connect to the same one first testing terminal 301, and arranging the ten second clock signal lines 202 to connect to one second testing terminal 302, compared with the situation in the related art that each clock signal line is connected to one testing terminal, the 15 first testing terminals 301 required to be disposed can be reduced to only 5 first testing terminals 301 and the ten second testing terminals 302 required to be disposed can be reduced to only one second testing terminal 302.

Optionally, the embodiment of the present disclosure provides two connection modes of at least two clock signal lines and a same testing terminal.

As one optional implementation mode, referring to FIG. 2, FIG. 7 and FIG. 8, in the at least two clock signal lines connected to a same testing terminal, one clock signal line may be directly connected to the testing terminal, and the at least two clock signal lines may be connected in sequence.

For example, referring to FIG. 7, among three clock signal lines connected to the same first testing terminal 301, one third clock signal line 203 is directly connected to the first testing terminal 301, and the other two first clock signal lines 201 may be sequentially connected to this third clock signal line 203 through connecting lines. Or referring to FIG. 8, among the three clock signal lines connected to the same testing terminal 301, one first clock signal line 201 is directly connected to the first testing terminal 301, and the two first clock signal lines 201 and the third clock signal line 203 are connected sequentially through connecting lines.

As another optional implementation mode, in the at least two clock signal lines connected to a same testing terminal, one target clock signal line is directly connected to the testing terminal, and any of the clock signal lines in the at least two clock signal lines other than the target clock signal line is connected to the target clock signal line.

Exemplarily, for the array substrate shown in FIG. 6, in the two first clock signal lines 201 connected to the same testing terminal 301, one target first clock signal line 201 may be directly connected to the first testing terminal 301, and the other first clock signal line 201 and one third clock signal line 203 may be connected to the target first clock signal line 201 respectively through connecting lines.

Figure 10:
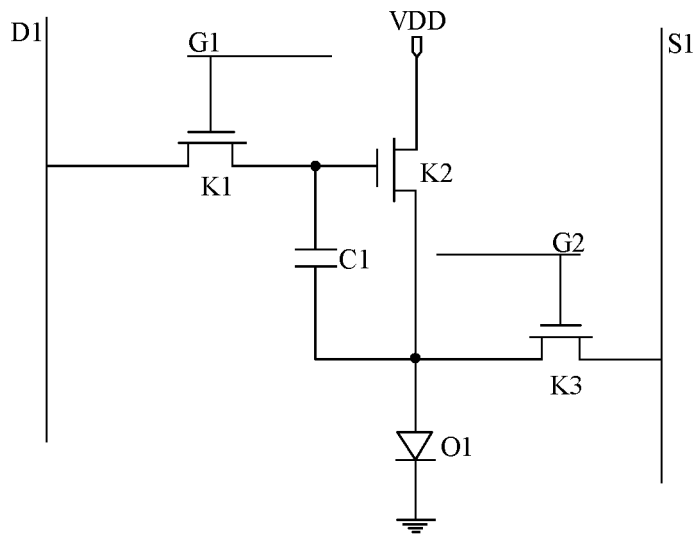
FIG. 10 is a schematic structural diagram of a pixel circuit included in an array substrate according to an embodiment of the present disclosure.

The array substrate according to the embodiment of the present disclosure may further include a plurality of pixel circuits arranged in an array. FIG. 10 is a schematic structural diagram of a pixel circuit according to an embodiment of the present disclosure. As shown in FIG. 10, each pixel circuit may include a switching transistor K1, a driving transistor K2, a detecting transistor K3, and a storage capacitor C1.

Referring to FIG. 10, a gate of the switching transistor K1 may be connected to the first gate line G1, a first electrode of the switching transistor K1 may be connected to a data signal terminal D1, and a second electrode of the switching transistor K1 may be connected to a gate of the driving transistor K2.

The first electrode of the driving transistor K1 may be connected to a direct current power terminal VDD and a second electrode of the driving transistor K2 may be connected to one end of a light-emitting element O1.

The gate of the detecting transistor K3 may be connected to the second gate line G2, the first electrode of the detecting transistor K3 may be connected to one end of the light-emitting element O1, and the second electrode of the detecting transistor K3 may be connected to a detecting signal line Si. During testing, the driving signals applied to the light-emitting elements O1 may be acquired through the detecting signal line Si.

One end of the storage capacitor C1 may be connected to the second electrode of the driving transistor K1 and the other end of the storage capacitor C1 may be connected to one end of the light-emitting element O1.

Optionally, the transistors in the pixel circuit may be all N-type transistors. Of course, the transistors in the pixel circuit may be all P-type transistors.

In summary, in the array substrate according to the embodiment of the present disclosure, the array substrate includes the plurality of clock signal lines and the plurality of testing terminals. Since at least two of the plurality of clock signal lines may be connected to a same testing terminal, the number of the testing terminals required to be disposed on the array substrate according to the embodiment of the present disclosure is relatively small compared to the situation in the related art that one clock signal line is connected to one testing terminal. Correspondingly, the number of the pins required to be contained in the testing device connected to the testing terminals on the array substrate according to the embodiment of the present disclosure can be relatively small. Therefore, the testing device has a relatively low production cost and a relatively small volume.

Figure 11:
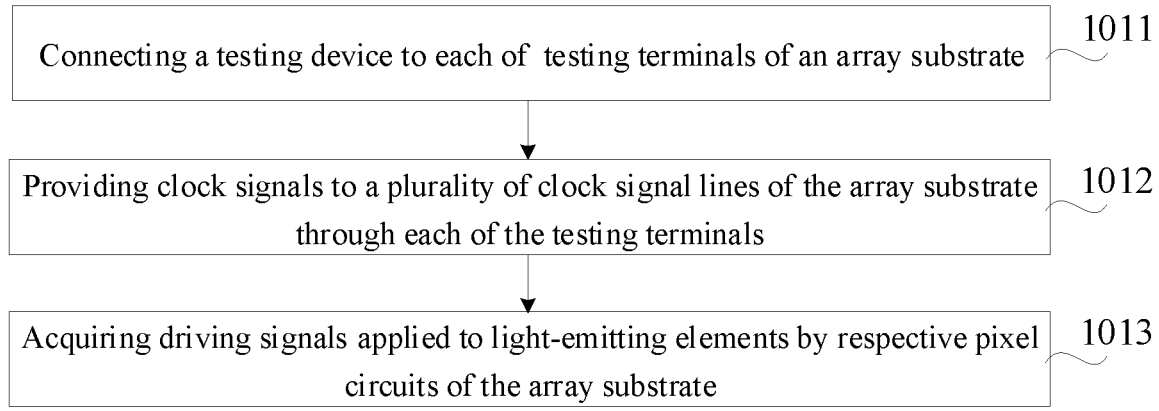
FIG. 11 is a flowchart showing a method of testing an array substrate according to an embodiment of the present disclosure.

FIG. 11 is a flowchart showing a method of testing an array substrate according to an embodiment of the present disclosure. The method may be configured to test the array substrate as shown in any of FIGS. 1-10. As shown in FIG. 11, the method may include the following steps.

In step 1011, a testing device is connected to each of testing terminals on an array substrate respectively.

In the embodiment of the present disclosure, the testing device may include a plurality of pins. During the testing, each testing terminal may be connected to one pin of the testing device and the respective testing terminals are connected to different pins.

In step 1012, clock signals are provided to a plurality of clock signal lines of the array substrate through each of the testing terminals.

In the embodiment of the present disclosure, the testing terminal may be connected to the clock signal line. Referring to FIGS. 1-6, it can be seen that at least two clock signal lines on the array substrate according to the embodiment of the present disclosure may be connected to a same testing terminal. The testing device may provide a clock signal to each testing terminal connected to the testing device, and thus each testing terminal outputs the clock signal to the clock signal line connected to the testing terminal.

In step 1013, driving signals applied to light-emitting elements by respective pixel circuits of the array substrate are acquired.

The driving signal may include a driving voltage or a driving current output by the pixel circuit to the light-emitting element. In the embodiment of the present disclosure, the gate driving circuit may be connected to the clock signal lines. After the testing device provides the clock signals to the clock signal lines through the testing terminals, the gate driving circuit may drive the pixel circuit to apply the driving signal to a light-emitting unit under the control of the clock signal provided by the clock signal line. Further, the testing device may acquire the driving signal applied by the pixel circuit to the light-emitting element, through the detecting signal line connected to the pixel circuit, and analyze the driving signal, so as to detect the performance of the transistors included in the pixel circuit. For example, whether a threshold voltage of the driving transistor in the pixel circuit drifts may be detected.

The circuit for providing the clock signals and the circuit for acquiring the driving signals in the testing device may be two circuits independent from each other, or may otherwise be an integrated circuit integrated on a chip.

In summary, in the method of testing an array substrate according to the embodiment of the present disclosure, as at least two of the plurality of clock signal lines on the array substrate tested by the testing method may be connected to a same testing terminal, compared to the situation in the related art that one clock signal line is connected to one testing terminal, the number of the testing terminals required to be disposed on the array substrate tested according to the embodiment of the present disclosure can be relatively small. Correspondingly, the number of pins of the testing device used during the testing can be relatively small. Therefore, the testing device has a relatively low production cost and a relatively small volume.

Optionally, referring to FIG. 6, the plurality of clock signal lines 20 of the array substrate according to the embodiment of the present disclosure may include a plurality of first clock signal lines 201, a plurality of second clock signal lines 202 and a plurality of third clock signal lines 203. The plurality of testing terminals 30 may include a plurality of first testing terminals 301 and one second testing terminal 302. In addition, every two first clock signal lines 201 may be connected to a same first testing terminal 301, the plurality of second clock signal lines 202 may be connected to one second testing terminal 302, and each third clock signal line 203 may be connected to one first testing terminal 301.

For example, referring to FIG. 6, the plurality of clock signal lines 20 shown in this figure include ten first clock signal lines 201, ten second clock signal lines 202 and 5 third clock signal lines 203. The plurality of testing terminals 30 include 5 first testing terminals 301 and 1 second testing terminal 302. Every two of the ten first clock signal lines 201 are connected to a same first testing terminal 301, the ten second clock signal lines 202 are all connected to one second testing terminal 302, and each of the 5 third clock signal lines 203 is connected to one first testing terminal 301.

Correspondingly, step 1012 above may include: sequentially providing clock signals to the plurality of first clock signal lines 201 and the plurality of third clock signal lines 203 through the first testing terminals 301, and providing clock signals at effective potentials to the plurality of second clock signal lines 202 through the second testing terminal 302.

The testing principle of the array substrate according to the embodiment of the present disclosure is introduced by taking the array substrate shown in FIG. 6 as an example and taking the transistor being an N-type transistor as an example.

Figure 12:
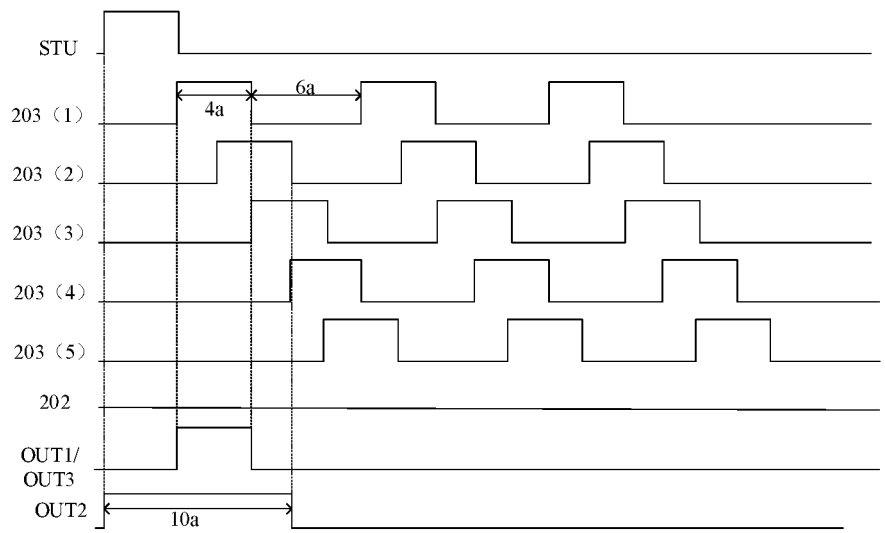
FIG. 12 is a timing diagram of the respective signals in an array substrate according to an embodiment of the present disclosure.

FIG. 12 is a timing diagram of signals output by the respective signal terminals in a gate driving circuit according to an embodiment of the present disclosure. As shown in FIG. 12, the testing device may sequentially provide clock signals to the first third clock signal line 203(1), the second third clock signal line 203(2), the third third clock signal line 203(3), the fourth third clock signal line 203(4) and the fifth third clock signal line 203(5) in the 5 third clock signal lines 203 included in the array substrate through the first testing terminals 301. Since every two first clock signal lines 201 are connected to one third clock signal line 203, while the testing device provides a clock signal to a certain third clock signal line 203 through the first testing terminal 301, the testing device may also provide the same clock signal to the two first clock signal lines 201 connected to the third clock signal line 203 through the first testing terminal 301. In addition, referring to FIG. 12, it can also be seen that the testing device may provide clock signals at effective potentials to the ten second clock signal lines 202 through the second testing terminal 302.

Referring to FIG. 12, in each clock cycle, durations of the effective potential and ineffective potential of the clock signal provided by the testing device to each third clock signal line 203 may be 4a and 6a respectively. That is, the duty ratio of the clock signal may be 40% (i.e., 2/5). In addition, referring to FIG. 12, it can also be seen that an interval, at which the testing device provides the clock signals to the two adjacent third clock signal lines 203, may be 2a. That is, an interval of rising edges of the clock signals provided to every two adjacent third clock signal lines 203 is ⅕ of the cycle of the clock signal.

Taking the first-stage shift register unit 101(1) as an example, in conjunction with FIGS. 9 and 12, when the potential provided by the testing device to the first third clock signal line 203(1) is effective, the switching output terminal OUT1 and the shift output terminal OUT3 of the first-stage shift register unit 101(1) may output signals at effective potentials. When the potential provided by the testing device to the first third clock signal line 203(1) jumps to an ineffective potential, the potentials of the signals output by the switching output terminal OUT1 and the shift output terminal OUT3 also jump to ineffective potentials.

In addition, referring to FIG. 12, it can be seen that the clock signals provided by the testing device to the second clock signal lines 202 are always at effective potentials, so that the first-stage shift register unit 101(1) may output signals at effective potentials through the detecting output terminal OUT2 thereof when the potential of its input terminal STU is at an effective potential. Referring to FIG. 9, as the reset terminal STD of the first-stage shift register unit 101(1) is connected to the shift output terminal OUT3 of the seventh-stage shift register unit 101(7), the shift output terminal OUT3 of the seventh-stage shift register unit 101(7) is configured to output the clock signal provided by the fourth third clock signal line 203(4). Therefore, as shown in FIG. 12, when the clock signal provided by the fourth third clock signal line 203(4) jumps to an effective potential, the shift output terminal OUT3 of the seventh-stage shift register unit 101(7) may reset the first-stage shift register unit 101(1). At this time, the potential of the signal output by the detecting output terminal OUT2 of the first-stage shift register unit 101(1) jumps to an ineffective potential from an effective potential.

Optionally, the effective potential and ineffective potential of the clock signal provided by the testing device to the third clock signal line 203 through the first testing terminal 301 may be 24 volts (V) and −10 V respectively. That is, the potential of the clock signal may range from −10 V to 24 V The potential of the clock signal at the effective potential provided by the testing device to each second clock signal line 202 through the second testing terminal 302 may be 24 V The effective potential and ineffective potential of the signal output by the switching output terminal OUT1, the detecting output terminal OUT2 and the shift output terminal OUT3 may be 24 V, and −6 V respectively.

Figure 13:
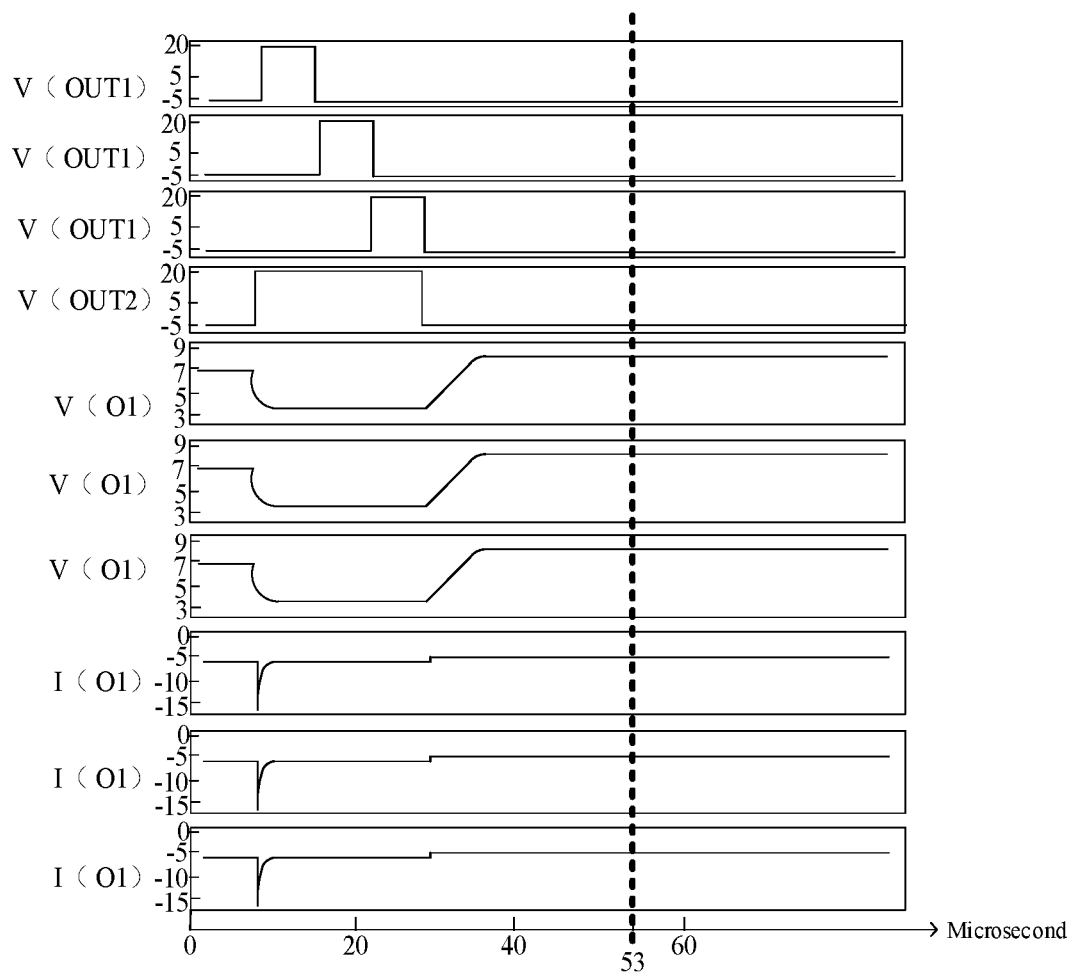
FIG. 13 is a timing simulation diagram of the respective signals in an array substrate according to an embodiment of the present disclosure.

Optionally, FIG. 13 illustrates a timing simulation diagram by taking a certain column of the light-emitting elements on the array substrate shown in FIG. 6 as an example. As shown in FIG. 13, the horizontal axis may represent time in microsecond (µs) and the vertical axis may represent voltage values in volt (V) and current values in microampere (µA).

For example, FIG. 13 illustrates clock signals output by each of the three shift register units 101 in the same column to its switching output terminal OUT1 and detecting output terminal OUT2. Referring to FIG. 13, it can be seen that these three shift register units 101 may sequentially output clock signals to their switching output terminals OUT1. That is, these three output terminals OUT1 may sequentially output clock signals and the effective potential and ineffective potential of the clock signal output by each shift register unit to its switching output terminal OUT1 are about 20 V and about −5 V respectively. In addition, the clock signals output by these three shift register units 101 to their detecting output terminals OUT2 are all the same, and the potential of the clock signal at effective potential output by the shift register unit 101 to the detecting output terminal OUT2 is about 20 V.

In addition, referring to FIG. 13, it can also be seen that among the three pixel circuits to which these three shift register units 101 are connected, driving voltages V(O1) and driving currents I(O1) applied by the respective pixel circuits to light-emitting elements O1 therewith are the same. In addition, the driving voltages V(O1) applied by the respective pixel circuits to the light-emitting elements O1 connected therewith may tend to become stable at the same time. For example, the three driving voltages V(O1) shown in FIG. 13 are all about 7 V at 53 µs. The driving currents I(O1) applied by the respective pixel circuits to the light-emitting elements O1 connected to these pixel circuits may also tend to become stable at the same time. For example, the three driving currents I(O1) shown in FIG. 13 are all about −5 µA at 53 µs.

When at least two clock signal lines are connected to the same testing terminal; the driving voltages V(O1) and the driving currents I(O1) applied by the respective pixel circuits in the plurality of pixel circuits in the same column to the light-emitting elements O1 connected therewith have only slight difference; and the driving voltages V(O1) and the driving currents I(O1) may both tend to a stable state. Therefore, it can be seen that this connection mode would not affect the CT detection and AT detection.

In summary, in the method of testing an array substrate according to the embodiment of the present disclosure, as at least two of the plurality of clock signal lines on the array substrate tested by the testing method may be connected to a same testing terminal, compared to the situation in the related art that one clock signal line is connected to one testing terminal, the number of the testing terminals required to be disposed on the array substrate tested according to the embodiment of the present disclosure is relatively small. Correspondingly, the number of the pins of the testing device used during the testing may be relatively small. Therefore, the testing device has a relatively low production cost and a relatively small volume.

A person skilled in the art may clearly understand that for the sake of convenience and conciseness in description, for the specific operation processes of the array substrate and the gate driving circuit descried above, reference can be made to the corresponding processes in the above method embodiments and are not further described herein.

The above descriptions are only optional embodiments of the present disclosure, and are not intended to limit the present disclosure. Any modifications, equivalent replacements, improvements and the like made within the spirit and principles of the present disclosure should be included within the scope of protection of the present disclosure.

What is claimed is:

1. An array substrate, comprising a gate driving circuit, a plurality of clock signal lines and a plurality of testing terminals, wherein a number of the clock signal lines is greater than a number of the testing terminals;
    the plurality of clock signal lines are connected to the gate driving circuit and the plurality of testing terminals, and at least two clock signal lines are connected to a same testing terminal; and
    the plurality of testing terminals are configured to connect to a testing device;
    wherein the gate driving circuit comprises a plurality of cascade-connected shift register units, and the plurality of clock signal lines comprise a plurality of first clock signal lines and a plurality of second clock signal lines, wherein each shift register unit is configured to output a clock signal provided by the first clock signal line to a switching output terminal connected to a first gate line and output a clock signal provided by the second clock signal line to a detecting output terminal connected to a second gate line; wherein the plurality of testing terminals comprises a plurality of first testing terminals and at least one second testing terminal;
    at least two of the plurality of first clock signal lines are connected to a same first testing terminal; and
    at least two of the plurality of second clock signal lines are connected to a same second testing terminal.

2. The array substrate according to claim 1, wherein the plurality of testing terminals comprises one second testing terminal, wherein all of the plurality of second clock signal lines are connected to the second testing terminal.

3. The array substrate according to claim 1, wherein at least two adjacent first clock signal lines are connected to the same first testing terminal.

4. The array substrate according to claim 1, wherein every two of the plurality of first clock signal lines are connected to the same first testing terminal.

5. The array substrate according to claim 1, wherein the plurality of clock signal lines further comprises a plurality of third clock signal lines; either odd-numbered-stage shift register units or even-numbered-stage shift register units in the plurality of cascade-connected shift register units are connected to the third clock signal lines, so as to output a clock signal provided by the third clock signal lines to a shift output terminal; and
    each of the plurality of third clock signal lines is connected to one of the first testing terminals, and each third clock signal line is connected to a different first testing terminal than other third clock signal lines.

6. The array substrate according to claim 5, wherein each of the third clock signal lines is directly connected to one of the first testing terminals; and the at least two first clock signal lines are connected to one of the third clock signal lines.

7. The array substrate according to claim 5, wherein the at least two first clock signal lines are directly connected to the same first testing terminal; and each of the third clock signal lines is connected to one of the at least two first clock signal lines.

8. The array substrate according to claim 5, wherein the plurality of clock signal lines comprises ten first clock signal lines, ten second clock signal lines and 5 third clock signal lines.

9. The array substrate according to claim 5, wherein each cascaded shift register unit that is connected to the third clock signal lines has a shift output terminal connected to input terminals of two stages of shift register units, and the two stages of shift register units are adjacent in stage.

10. The array substrate according to claim 1, further comprising a plurality of pixel circuits, each of the pixel circuits comprising a switching transistor, a driving transistor, a detecting transistor and a storage capacitor, wherein
    the switching transistor has a gate connected to the first gate line, a first electrode connected to a data signal terminal, and a second electrode connected to a gate of the driving transistor;
    the driving transistor has a first electrode connected to a direct current power terminal, and a second electrode connected to one end of a light-emitting element;
    the detecting transistor has a gate connected to the second gate line, a first electrode connected to one end of the light-emitting element and a second electrode connected to a detecting signal line; and
    the storage capacitor has one end connected to the gate of the driving transistor and the other end connected to one end of the light-emitting element.

11. The array substrate according to claim 1, wherein each of the shift register units comprises a shift sub-circuit, a first output transistor and a second output transistor; wherein
    the shift sub-circuit is connected to a pull-up node;
    the first output transistor has a gate connected to the pull-up node, a first electrode connected to one of the first clock signal lines, and a second electrode connected to the switching output terminal; and
    the second output transistor has a gate connected to the pull-up node, a first electrode connected to one of the second clock signal lines, and a second electrode connected to the detecting output terminal.

12. The array substrate according to claim 11, comprising a pull-down power line; wherein each of the shift register units further comprises a first pull-down transistor and a second pull-down transistor; the shift sub-circuit is further connected to a pull-down node;

the first pull-down transistor has a gate connected to the pull-down node, a first electrode connected to the pull-down power line, and a second electrode connected to the switching output terminal; and the second pull-down transistor has a gate connected to the pull-down node, a first electrode connected to the pull-down power line, and a second electrode connected to the detecting output terminal.

13. The array substrate according to claim 1, wherein in the at least two clock signal lines connected to a same testing terminal, one clock signal line is directly connected to the testing terminal, and the at least two clock signal lines are connected sequentially.

14. The array substrate according to claim 1, wherein in the at least two clock signal lines connected to a same testing terminal, one target clock signal line is directly connected to the testing terminal, and any of the at least two clock signal lines other than the target clock signal line is connected to the target clock signal line.

15. The array substrate according to claim 1, further comprising an electrostatic discharge circuit, wherein the electrostatic discharge circuit is connected to the plurality of clock signal lines and an electrostatic discharge line respectively.

16. The array substrate according to claim 2, wherein the plurality of clock signal lines further comprises a plurality of third clock signal lines; odd-numbered-stage shift register units of the plurality of cascade-connected shift register units are configured to output a clock signal provided by the third clock signal lines to a shift output terminal;

each of the plurality of third clock signal lines is directly connected to one of the first testing terminals, each third clock signal line is connected to a different first testing terminal, and every two adjacent first clock signal lines in the plurality of first clock signal lines are connected to a same third clock signal line;

each of the shift register units comprises a shift sub-circuit, a first output transistor, a second output transistor, a first pull-down transistor, and a second pull-down transistor, wherein the shift sub-circuit is connected to a pull-up node and a pull-down node respectively;

both a gate of the first output transistor and a gate of the second output transistor are connected to the pull-up node, and the first output transistor has a first electrode connected to one of the first clock signal lines, and a second electrode connected to the switching output terminal; the second output transistor has a first electrode connected to one of the second clock signal lines, and a second electrode connected to the detecting output terminal; and both a gate of the first pull-down transistor and a gate of the second pull-down transistor are connected to the pull-down node, both a first electrode of the first pull-down transistor and a first electrode of the second pull-down transistor are connected to a pull-down power line, a second electrode of the first pull-down transistor is connected to the switching output terminal, and a second electrode of the second pull-down transistor is connected to the detecting output terminal; and the array substrate further comprises a plurality of pixel circuits, wherein each of the pixel circuits comprises a switching transistor, a driving transistor, a testing transistor and a storage capacitor, wherein the switching transistor has a gate connected to the first gate line, a first electrode connected to a data signal terminal, and a second electrode connected to a gate of the driving transistor; the driving transistor has a first electrode connected to a direct current power terminal, and a second electrode connected to one end of a light-emitting element; the detecting transistor has a gate connected to the second gate line, a first electrode connected to one end of the light-emitting element and a second electrode connected to a detecting signal line; and the storage capacitor has one end connected to the gate of the driving transistor and the other end connected to one end of the light-emitting element.

17. A method of testing an array substrate, applied to the array substrate according to claim 1, the method comprising:

connecting a testing device to each of the testing terminals of the array substrate respectively;

providing clock signals to a plurality of clock signal lines of the array substrate through each of the testing terminals; and acquiring driving signals applied to light-emitting elements by respective pixel circuits of the array substrate.

18. The method according to claim 17, wherein the plurality of clock signal lines comprises a plurality of first clock signal lines, a plurality of second clock signal lines and a plurality of third clock signal lines, and the plurality of testing terminals comprises a plurality of first testing terminals and one second testing terminal, wherein every two first clock signal lines are connected to a same first testing terminal, the plurality of second clock signal lines are connected to one second testing terminal, and each of the third clock signal lines is connected to one of the first testing terminals; and said providing clock signals to the plurality of clock signal lines of the array substrate through each of testing terminals comprises:

sequentially providing clock signals to the plurality of first clock signal lines and the plurality of third clock signal lines through the first testing terminals; and providing a clock signal at effective potential to the plurality of second clock signal lines through the second testing terminal.

19. The method according to claim 18, wherein a duty ratio of the clock signals provided to the plurality of first clock signal lines and the plurality of third clock signal lines is 2/5, and an interval of rising edges of clock signals provided to every two adjacent third clock signal lines is ⅕ of a cycle of the clock signal.

* * * * *